(12) United States Patent
Mardi et al.

(10) Patent No.: US 10,571,517 B1
(45) Date of Patent: Feb. 25, 2020

(54) PROBE HEAD ASSEMBLY

(71) Applicant: Xilinx, Inc., San Jose, CA (US)

(72) Inventors: Mohsen H. Mardi, Saratoga, CA (US); Lik Huay Lim, Singapore (SG); King Yon Lew, Simei (SG); Andy Widjaja, Singapore (SG)

(73) Assignee: XILINX, INC., San Jose, CA (US)

( * ) Notice: Subject to any disclaimer, the term of this patent is extended or adjusted under 35 U.S.C. 154(b) by 76 days.

(21) Appl. No.: 15/829,620

(22) Filed: Dec. 1, 2017

(51) Int. Cl.
*G01R 31/00* (2006.01)
*G01R 31/28* (2006.01)

(52) U.S. Cl.
CPC .................. *G01R 31/2889* (2013.01)

(58) Field of Classification Search
CPC ....... H01L 2224/48227; H01L 21/4853; H01L 2224/12; H01L 2224/16227; H01L 2224/45; H01L 2224/49; H01L 2224/78; H01L 24/81; H01L 24/17; H01L 24/48; H01L 24/49; H01L 24/78; H01L 2924/3511; H01L 21/67288; G01R 31/2889; G01R 1/07378; G01R 31/2891; G01R 31/2886; G01R 1/06711; G01R 1/07364; G01R 31/31905; G01R 1/07307; G01R 1/06744; G01R 1/07371; G01R 31/2863; G01R 31/2884; G01R 1/0408; G01R 1/44; G01R 1/06705; G01R 1/0675; G01R 31/2831; G01R 31/2893; G01R 31/311; H01R 12/57; H01R 12/62; H01R 12/718; H01R 12/52; H01R 12/79; H01R 13/24; H01R 13/2485; H01R 12/78; H01R 12/88
See application file for complete search history.

(56) References Cited

U.S. PATENT DOCUMENTS

| | | | | |
|---|---|---|---|---|
| 5,791,914 | A * | 8/1998 | Loranger | H01R 13/24 439/66 |
| 5,800,184 | A | 9/1998 | Lopergolo et al. | |
| 7,486,525 | B2 * | 2/2009 | Knickerbocker | G01R 1/0425 174/261 |
| 2010/0026331 | A1 * | 2/2010 | Chong | G01R 1/07342 324/754.03 |
| 2014/0253165 | A1 * | 9/2014 | Kim | G01R 1/07378 324/756.03 |

* cited by examiner

*Primary Examiner* — Vinh P Nguyen
(74) *Attorney, Agent, or Firm* — Keith Taboada

(57) ABSTRACT

Examples of the present disclosure generally relate to a probe head assembly having modular interposer and a test system having the same. In one example, a probe head assembly includes a rigid stiffener plate, a PIB substrate, a bracket, a plurality of interposers disposed in the bracket, a probe card board electrically coupled by a plurality of contact pins disposed through the interposers to the PIB substrate, and a probe card electrically coupled to the probe card board. The PIB substrate, the interposers and the probe card board are sandwiched between the stiffener plate and the probe card.

18 Claims, 7 Drawing Sheets

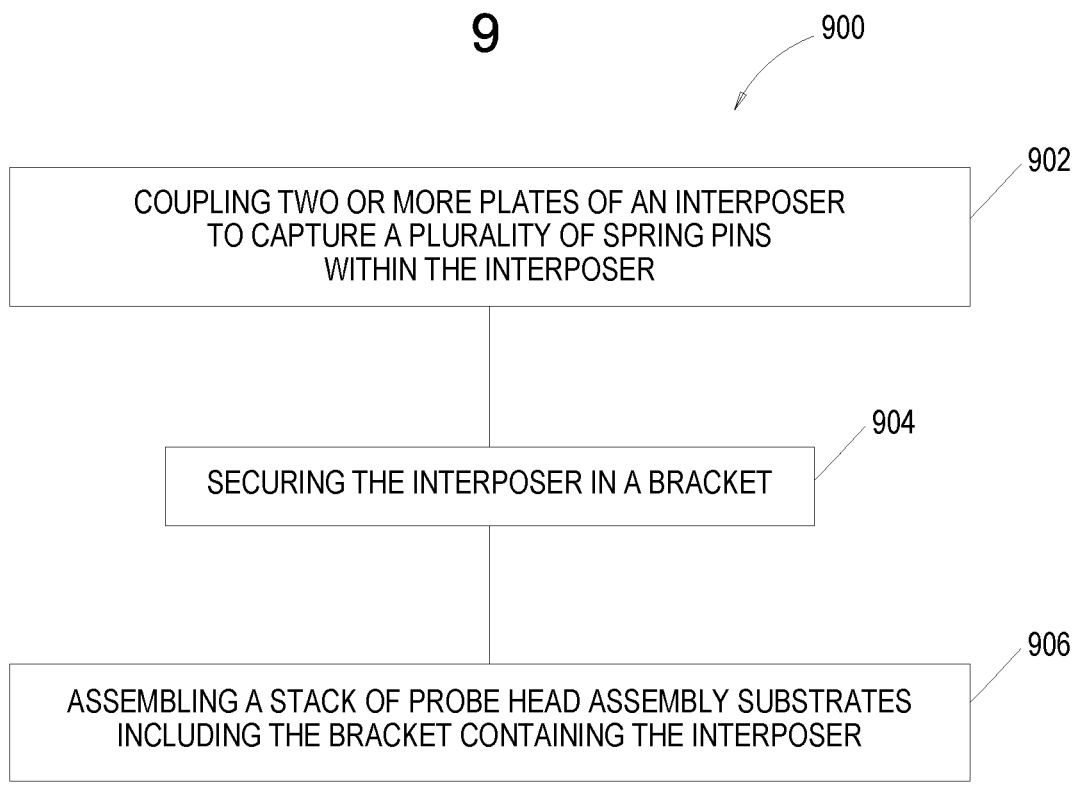

PROBE HEAD ASSEMBLY

TECHNICAL FIELD

Examples of the present disclosure generally relate to wafer level testing and, in particular, to a wafer test system with probe head assembly having a modular interposer.

BACKGROUND

In semiconductor processing, integrated circuits are generally formed on dies on a wafer. Processing for forming the integrated circuits can be subject to variation and error. To address this, designers can implement test structures in the wafer, such as along scribe lines between dies. The test structures and/or the integrated circuit of each die can be subjected to testing to help ensure that each integrated circuit is fully functional.

Wafer level testing (or wafer sorting) is a testing mechanism for testing test structures and/or integrated circuits on a wafer prior to dicing (i.e., separating dice from the wafer). Wafer level testing uses probes to provide electrical signals to contact pads on the wafer, and can determine whether the integrated circuit or test structure under test is functional based on responses of the integrated circuit or test structure to the electrical signals. A probe head assembly having a probe card can provide an interface between the wafer to be tested and a processor-based controller that provides the electrical signals and receives the responses to those electrical signals as part of the wafer test routing.

Since batches of wafer being tested are often different, different probe cards may be needed to interface the test system with the current wafer under test. Changing probe cards is time consuming, and often the electric connections within the probe head assembly may become loose or damaged, causing further cost and delays.

Thus, there is a need for an improved probe head assembly.

SUMMARY

Examples of the present disclosure generally relate to a test system with probe head assembly having a modular interposer. The modular interposer facilitates rapid change between probe cards while mitigating potential for damaged and lost electrical connection within the probe head assembly. The ability to rapidly change probe cards without lost or damage electrical connections advantageously facilitates faster wafer testing throughput while reducing the cost of ownership of the test system.

In one example, a probe head assembly includes a rigid stiffener plate, a PIB substrate, a bracket, a plurality of interposers disposed in the bracket, a probe card board electrically coupled by a plurality of contact pins disposed through the interposers to the PIB substrate, and a probe card electrically coupled to the probe card board. The PIB substrate, the interposers and the probe card board are sandwiched between the stiffener plate and the probe card.

In another example, probe head assembly is provided that includes a rigid stiffener plate, a PIB substrate, a plurality of interposers comprising a first interposer and a second interposer, a bracket having the first and second interposers secured thereto, a probe card board, and a probe card electrically coupled to the probe card board. The PIB substrate, the first and second interposers, and the probe card board are sandwiched between the stiffener plate and the probe card. Each of the first and second interposers are independently removable from the bracket. The first interposer includes a plurality of contact pins captured within the interposer. The probe card board electrically is coupled by the contact pins disposed through the first interposer to the PIB substrate.

In another example, a method for assembling a probe head assembly is provided that includes coupling two for more plates of an interposer to capture a plurality of contact pins within the interposer, securing the interposer in a bracket, and assembling a stack of probe head assembly substrates including the bracket containing the interposer.

BRIEF DESCRIPTION OF THE DRAWINGS

So that the manner in which the above-recited features of the present disclosure can be understood in detail, a more particular description of the disclosure, briefly summarized above, may be had by reference to example implementations, some of which are illustrated in the appended drawings. It is to be noted, however, that the appended drawings illustrate only typical example implementations and are therefore not to be considered limiting of its scope, for the disclosure may admit to other equally effective examples.

FIG. 9 is a flow diagram of method for assembling a probe head assembly.

To facilitate understanding, identical reference numerals have been used, where possible, to designate identical elements that are common to the figures. It is contemplated that elements of one example may be beneficially incorporated in other examples.

DETAILED DESCRIPTION

Examples described herein provide test system with probe head assembly having modular interposers. Each of the modular interposers includes a plurality of electrical spring contact pins. The contact pins are captured within each of the modular interposer, and thus, cannot become loose, lost, or damaged during changing of a prober card or other component of the probe head assembly. Moreover, the modularity of the interposers allows individual interposers to be changed out should one of the contact pins disposed in one of the interposers become damaged, thereby allowing very rapid repair with reduced spare part costs. The modularity of the interposers and the captured contact pins advantageously increases testing capacity (i.e., wafer testing throughput) while reducing the cost of replacement components, thus reducing the cost of ownership of the test system while also reducing the cost of wafer testing.

Figure 1:
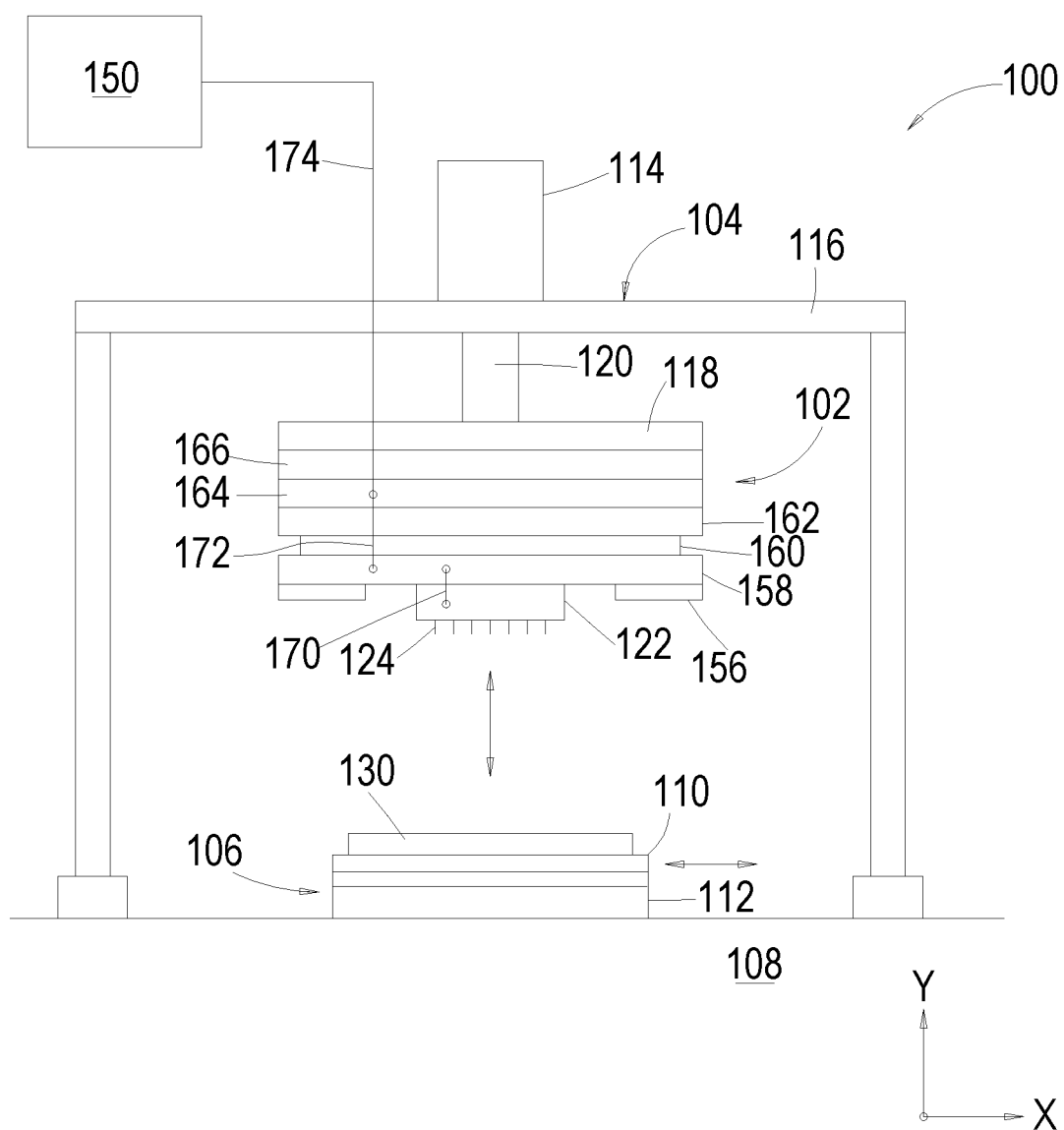
FIG. 1 is a simplified schematic side view of a test system having a probe head assembly.

Turning now to FIG. 1, FIG. 1 is a simplified schematic side view of a test system 100 having a probe head assembly 102. In addition to the probe head assembly 102, the test system 100 includes a probe head support 104, a test bed 106, a base 108 and a test controller 150. The test controller 150 controls the operation of the test system 100 such that a wafer 130 disposed in the test bed 106 may be tested. Some examples of wafer test routines that can be implemented by the test controller 150 on the wafer 130 disposed in the test system 100 include die functionally testing, burn-in, continuity testing, high temperature testing, dielectric breakdown testing and the like.

The test bed 106 is disposed on the base 108. The test bed 106 supports the wafer 130 while the wafer 130 is being tested by the test system 100. In one example, the test bed 106 includes a wafer holder 110. The wafer holder 110 may be configured to physically retain the wafer 130 to the holder 110, for example, by mechanical clamping, vacuum or electrostatic chucking.

The wafer holder 110 is disposed on a wafer support 112. The wafer support 112 may statically retain the wafer holder 110 to the test bed 106. Alternatively and as shown in the example depicted in FIG. 1, the wafer support 112 is configured to move the wafer holder 110 (and wafer 130 retained therein) in an X-Y plane so as to programmably position the wafer 130 in below the probe head assembly 102 to facilitate execution of the test routine. In one example, the wafer support 112 has an X-Y actuator (e.g., an X-Y table).

The probe head support 104 suspends the probe head assembly 102 over the wafer holder 110 of the test bed 106. The probe head support 104 generally includes an actuator 114, an overhead support 116 and a clamp head 118. The actuator 114 is coupled to the overhead support 116. The clamp head 118 is coupled to the actuator 114 by a shaft 120. The clamp head 118 is configured to removably retain the probe head assembly 102. The actuator 114 is configured to displace the clamp head 118 and the probe head assembly 102 in a direction perpendicular to the wafer holder 110 and base 108 (e.g., the Z direction). The actuator 114 may be a pneumatic cylinder, motor or other linear actuator.

The overhead support 116 generally positions the probe head assembly 102 over the wafer holder 110 of the test bed 106. In one example, the overhead support 116 may include one or more stanchions and cross members that statically position the probe head assembly 102 over the wafer holder 110 of the test bed 106. In another example, the overhead support 116 may include an X-Y motion mechanism such as a gantry that is configured to programmably position the probe head assembly 102 over the wafer holder 110 of the test bed 106 in a manner that facilitates execution of the test routine.

Figure 2:
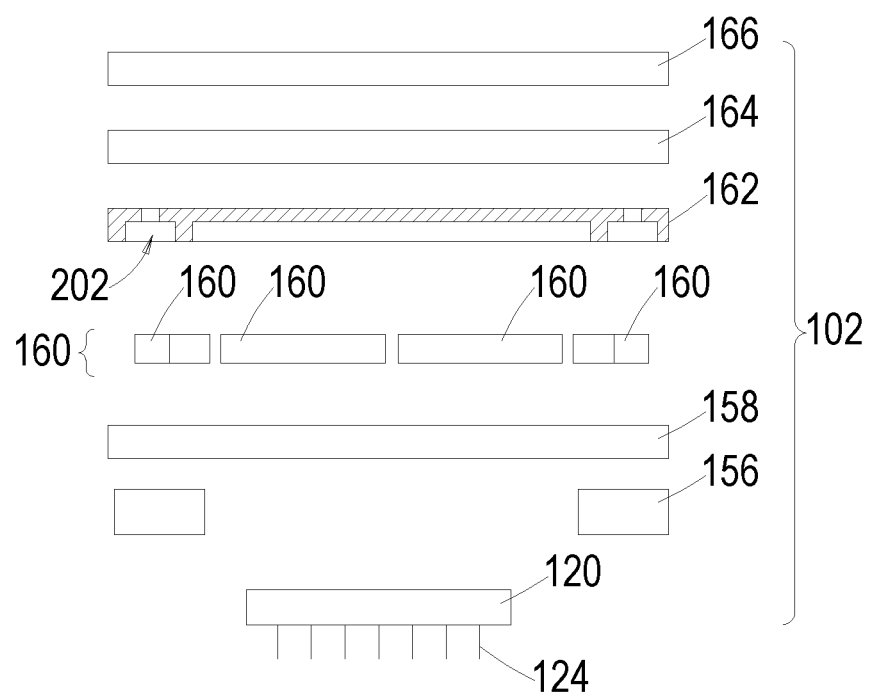
FIG. 2 is an exploded view of the probe head assembly of FIG. 1.

The probe head assembly 102 generally includes a plurality of stacked substrates. The plurality of stacked substrates of the probe head assembly 102 are also illustrated in an exploded view of the probe head assembly 102 depicted in FIG. 2. Referring now both to FIGS. 1 and 2, the substrates comprising the probe head assembly 102 include a stiffener plate 166, a probe interface board (PIB) substrate 164, a bracket 162, a plurality of interposers 160, a probe card board 158 and the probe card 122. The stiffener plate 166 provides rigidity to the probe head assembly 102 and also provides an interface for mounting the probe head assembly 102 to the clamp head 118. The stiffener plate 166 may be fabricated from a metal or other sufficiently rigid material. In one example, the stiffener plate 166 is fabricated from aluminum or stainless steel. The stiffener plate 166 may be removably coupled to the clamp head 118 by any suitable method, for example, using fasteners or latches.

The PIB substrate 164 is mounted below the stiffener plate 166. The PIB substrate 164 provides a mounting surface for various circuitry utilized during testing of the wafer 130.

The bracket 162 is mounted below the PIB substrate 164. The bracket 162 may be formed from a rigid material, such as aluminum, stainless steel, glass reinforced resin, or other suitable material. The bracket 162 retains the plurality of interposers 160 in a predefined position such that robust electrical signal transfer may be maintained between the PIB substrate 164 and probe card board 158 through the interposers 160. For example, the bracket 162 is shown in FIG. 2 in cross section to illustrate a channel 202 in which at least one or more of the interposers are retained. The channel 202 and the interface in general between the interposers 160 and bracket 162 are further discussed below.

The probe card 122 is mounted below the interposers 160 retained in the bracket 162. The probe card 122 includes a plurality of electrical contact probes 124 extending therefrom which are utilized to make electrical contact with the wafer 130 to facilitate signal transfer therebetween during testing. The contact probes 124 generally have a predefined pattern for a probe card 122 configured to engage a specific test pad configuration disposed on a given wafer 130. Thus, when a wafer 130 having a different test pad configuration is to be tested using the test system 100, the probe card 122 is replaced with another probe card 122 having a complimentary arrangement of contact probes 124 configured to matingly engage with the wafer 130 to be tested. In one example, the probe card 122 is a multi-layer ceramic (MLC) wafer.

The probe head assembly 102 may also include a cover plate 156. The cover plate 156 is disposed below the probe card 122, but is free and clear of the contact probes 124 so as not to interfere with electrical connections between the contact probes 124 and the wafer 130.

Figure 3:
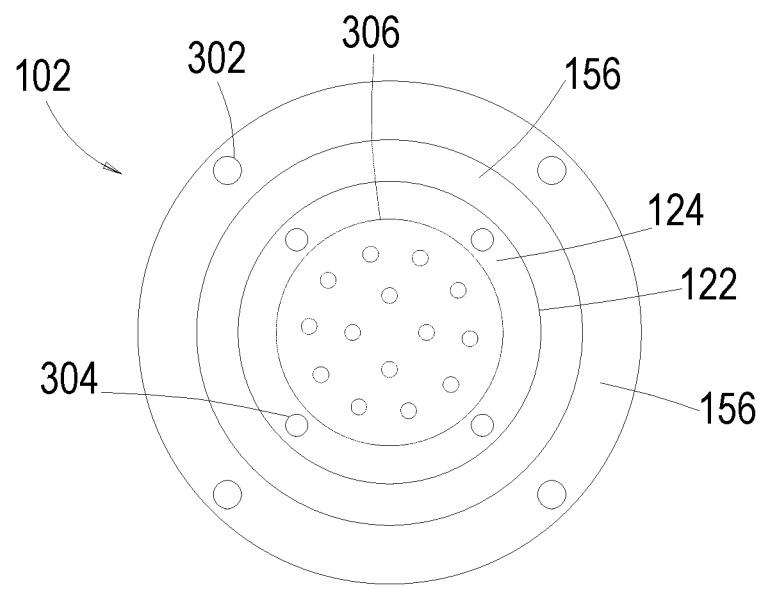
FIG. 3 is a bottom view of probe head assembly of FIG. 1.

Referring now briefly a bottom view of probe head assembly 102 illustrated in FIG. 3, the cover plate 156 may have a ring shape that circumscribes the contact probes 124. The contact probes 124 extend from the probe card 122 and define a contact region 306, shown in phantom. The contact probes 124 engage the wafer 130 (shown in FIG. 1) while performing the test routine. The ring-shape of the cover plate 156 circumscribes the contact region 306 in a position well clear of the contact probes 124 so that the contact probes 124 may freely engage the wafer 130 during test. The cover plate 156 is generally fabricated from a rigid material. In one example, the cover plate 156 may be fabricated from aluminum or stainless steel.

The cover plate 156 is removably coupled to the stiffener plate 166 of other structural member within the probe head assembly 102, for example by fasteners 302. The cover plate 156 sandwiches the probe card board 158, interposers 160 and probe card board 158 with the stiffener plate 166. The cover plate 156 may be fabricated from the same materials as the stiffener plate 166. With the rigid materials of the cover plate 156 and the stiffener plate 166 disposed on opposite sides of the probe head assembly 102, the probe head assembly 102 is very dimensionally stabile such that the contact probes 124 can accurately and precisely align and contact with the contact pads disposed on wafer 130 so that robust signal transfer may be made between the controller 150 and wafer 130 to facilitate wafer level testing.

Also depicted in FIG. 3, are fasteners 304 utilized to removably couple the probe card 122 to the probe card board 158. In one example, the fasteners 304 may be engaged with at least one of the stiffener plate 166, other substrate of the probe head assembly 102 or clamp head 118.

Returning to FIGS. 1 and 2 and as discussed briefly above, the controller 150 is coupled to the probe card 122 through the probe head assembly 102 to facilitate testing of the wafer 130. To facilitate connection between the controller 150 and contact probes 124 extending from the probe card 122, the probe head assembly 102 includes a number of electrical contacts between the substrates comprising the probe head assembly 102. A first plurality of electrical contacts 170 (one of which is shown in FIG. 1) are made between contact pads disposed on the probe card 122 and contact pads disposed on a first surface of the probe card board 158 that faces the probe card 122.

The contact pads disposed on the first surface of the probe card board 158 are coupled via circuitry to contact pads disposed on a second surface of the probe card board 158 that faces the interposers 160. A second plurality of electrical contacts 172 (one of which is shown in FIG. 1) are made between contact pads disposed on the probe card board 158 and contact pads disposed on a first surface of the PIB substrate 164 that faces the probe card board 158. The second plurality of electrical contacts 172 are made utilizing conductive spring contact pins (for example, pogo-pins, H-pins and the like) that are disposed though the interposers 160. The construction of the interposer 160 is described further below. The circuitry that is coupled to the contact pads of the PIB substrate 164 are coupled by routing 174 to the controller 150. The routing 174 may be run through the stiffener plate 166 to the controller 150 in any suitable manner.

Figure 4:
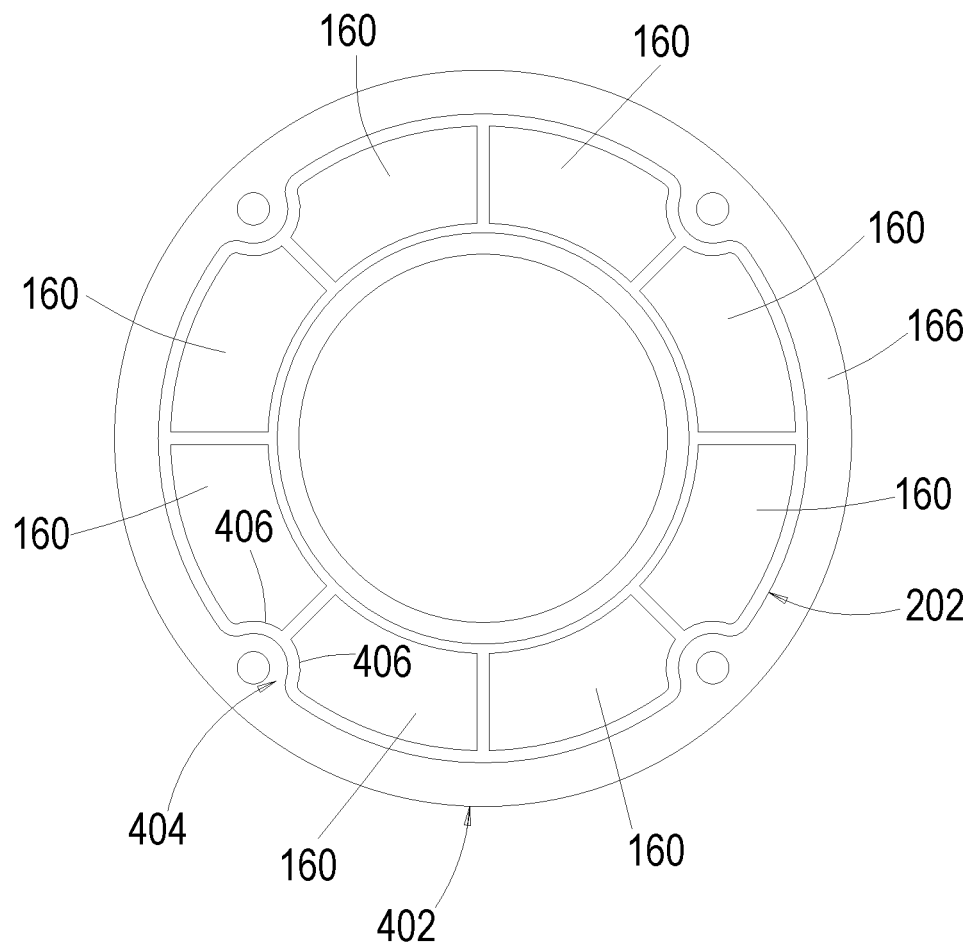
FIG. 4 is a bottom view of a plurality of interposers disposed in a mounting bracket of the probe assembly of FIG. 1.
Figure 5:
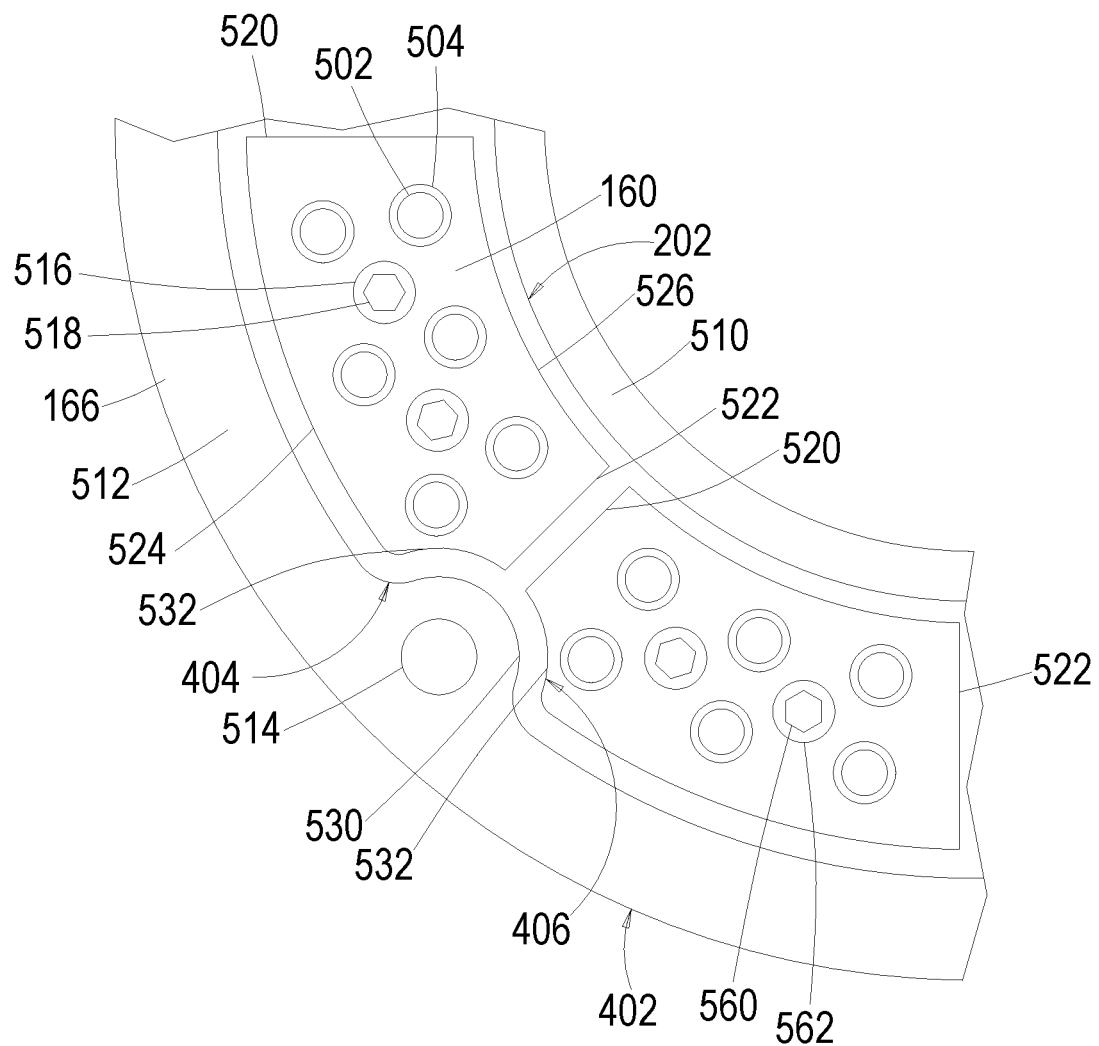
FIG. 5 is an enlarged partial bottom view of a portion of the interposers disposed in the mounting bracket illustrated in FIG. 4.

FIG. 4 is a bottom view of the plurality of interposers 160 disposed in the mounting bracket 162 of the probe head assembly 102 with other substrates of the probe head assembly 102 removed. FIG. 5 is an enlarged partial bottom view of two of the interposers 160 disposed in the mounting bracket 162 depicted in FIG. 4. Referring now to both FIGS. 4 and 5, the bracket 162 includes the channel 202 in which the plurality of interposers 160 are retained. The channel 202 may be formed between sidewalls 510, 512 that extend from a body 402 of the bracket 162. The body 402 of the bracket 162 has a ring shape, although of shapes may be utilized.

The interposers 160 are mated with the bracket 162 in a manner that retains the interposers 160 in a predefined orientation and position on the bracket 162. In the example depicted in FIG. 4, the interposers 160 have a curved shape, for example an arc segment, such that the plurality of interposers 160 may be arranged on a common diameter to form a ring shape within the channel 202. The channel 202 has a complimentary ring shape. The ring shape of the channel 202 may be square, rectangular, circular or have another geometry. In one example, the interposers 160 may be disposed in a circle where one end 520 of the interposer 160 faces an opposite end 522 of the adjacent interposer 160. When disposed in the channel 202, a first side 526 of the interposer 160 is disposed adjacent the inner sidewall 510 of the bracket 162, while a second side 526 of the interposer 160 is disposed adjacent the outer sidewall 512 of the bracket 162.

The bracket 162 may include a mating feature 404 that mates with a complimentary mating feature 406 of at least one of the interposers 160. In the example depicted in FIG. 4 at least one of the sidewalls 510, 512 includes a mating feature 406 in the form of a projection 530 that mates with a complimentary mating feature 406 in the form of a recess 532 formed in a body 402 of at least one interposer 160. For example, the projection 530 may extend into the recess 532 formed in the body 402 of a single interposer 160. In the example depicted in FIGS. 4 and 5, the complimentary mating feature 406 is defined by the neighboring recesses 532 formed in adjacent surfaces of neighboring interposers 160 such that the projection 530 extending into the recess 532 not only locks the position of each interposer 160 to the bracket 162, but also locks the orientation of the neighboring interposers 160 relative to each other. For example, the ends 520, 522 of the neighboring interposers 160 may each include recesses 532 that together form one mating feature 406 that engages and receives a single projection 530 of the mating feature 404 extending from the bracket 162. In another example, opposing sidewalls 524, 526 of the neighboring interposers 160 may each include recesses 532 that together form one mating feature 406 that engages and receives a single projection 530 of the mating feature 404 extending from the bracket 162. In the example depicted in FIG. 5, the recess 532 is partially formed in the ends 520, 522 and the sidewalls 524, 526, or stated differently, at the intersection between the ends 520, 522 and the sidewalls 524, 526. Optionally, a hole 514 may be formed through the projection 530 to accommodate the fastener 302 shown in FIG. 3.

In one example, the projections 530 may be a contiguous part of the body 402 of the bracket 162, For example, the projections 530 may be a contiguous part of the sidewalls 510, 512 of the channel 202 or other portion of the body 402. Alternatively, the projections 530 may be coupled to or extend through the body 402 of the bracket 162. For example, the projection 530 may be in the form of a dowel pin, c-section spring pin, key or other projection having one end connected to the body 402 and a second end extending from the body 402 into the interposer 160. It is contemplated that the mating features 404 may be configured in other manners while still providing the function of physically locating and retaining the interposer 160 in predefined position on the body 402 of the bracket 162.

Each interposer 160 includes a plurality of spring contact pins 502 disposed in a respective hole 504 formed through the body 660 of the interposer 160. The contact pins 502 are retained in the interposer 160, as further discussed below with reference to FIG. 6. Although only 6 contact pins 502 are shown for convenience of illustration, any number of contact pins 502 may be utilized as desired within the space constraints of a particular sized interposer 160.

Figure 6:
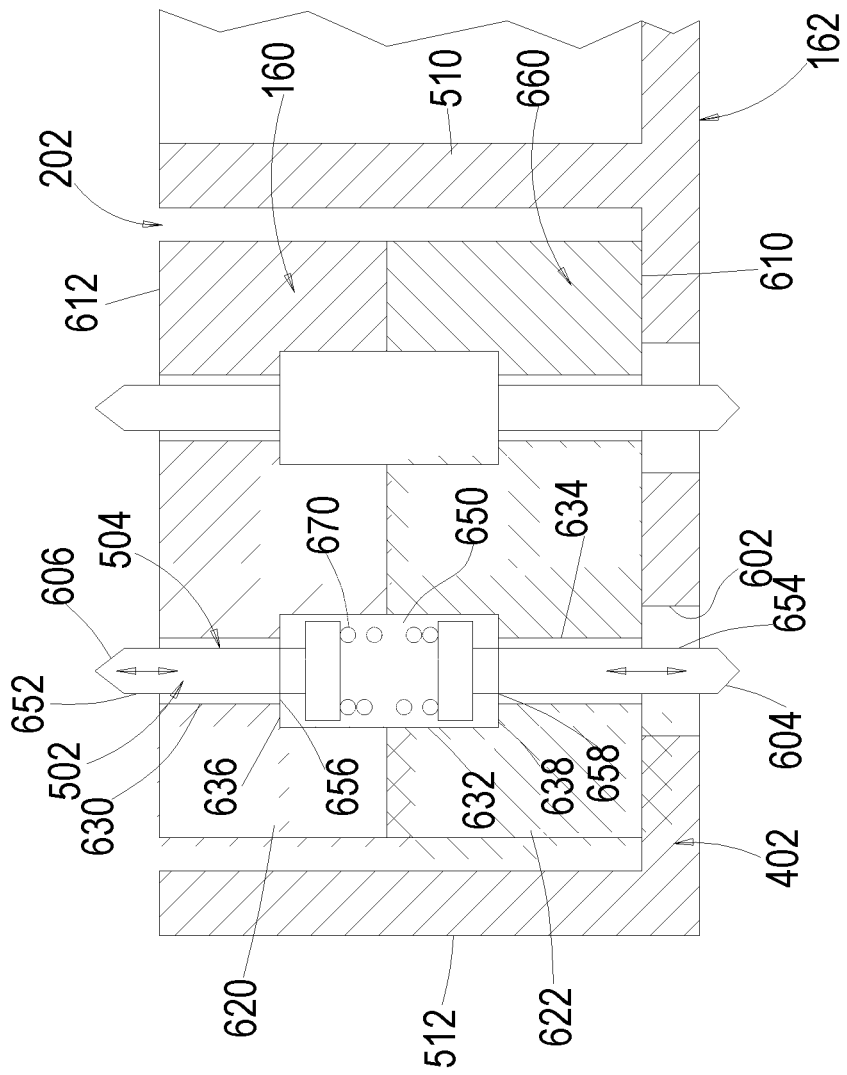
FIG. 6 is a sectional view of an interposer disposed in the mounting bracket.

FIG. 6 is a sectional view of one of the interposers 160 disposed in the mounting bracket 162 illustrating two contact pins 502. Each contact pins 502 has a first end 604 and a second end 606 that project beyond the body 660 of the interposer 160. The contact pins 502 are configured to permit high frequency signal transmission between the first end 604 and the second end 606 of the pin 502 to facilitate electrical transmission between the probe card board 158 and the PIB substrate 164, as illustrated by the electrical contact 172 of FIG. 1. The ends 442, 444 of each pin 502 are biased apart, for example by spring, to ensure good electric contact between the pin 502 on the contact pads of the probe card board 158 and the PIB substrate 164.

In the example depicted in FIG. 6, the first end 604 of the contact pin 502 projects beyond a first surface 610 of a body 660 of the interposer 160 and through an aperture 602 formed through the body 402 of the bracket 162. The first end 604 of the contact pin 502 may be displaced towards the first surface 610 of the body 660 of the interposer 160 a sufficient distance to ensure good electrical connection with the PIB substrate 164 without damage to either the PIB substrate 164 or the contact pin 502.

The second end 606 of the pin 502 of the contact pin 502 projects above a second surface 612 of the body 660 of the interposer 160. The second end 606 of the contact pin 502 may be displaced towards the second surface 612 of the body 660 of the interposer 160 a sufficient distance to ensure good electrical connection with the probe card board 158 without damage to either the probe card board 158 or the pin 502.

The apertures 602 disposed in the channel 202 and formed through the body 402 of the bracket 162 may be circular, elongated slits or have another shape. Each aperture 602 is disposed behind at least one of the interposers 160. Each aperture 602 may accommodate a single spring pin 502 as shown in FIG. 6, or may accommodate multiple spring pins 502.

The interposer 160 generally has a height that is less than a height of the sidewalls 510, 512 of the bracket 162. Thus, the second surface 612 of the interposer 160 is slightly recessed below the sidewalls 510, 512 of the bracket 162 so that the bracket 162 will bear on the probe card board 158 upon assembly of the probe head assembly 102, and provide more desirable parallelism and rigidity of the probe head assembly 102.

Continuing to refer to the sectional view of FIG. 6, the body 660 of the interposer 160 is comprised of at least two plates, shown in FIG. 6 as a first plate 620 and a second plate 622. The plates 620, 622 are generally fabricated from a dimensionally non-conductive material, such as an engineering thermoplastic, for example a polymer, such as acetal among others.

The pin holes 504 are formed through the plates 620, 622, with each end of the pin holes 504 exiting the body 402 on opposite surfaces 610, 612 of the interposer 160. Each pin hole 504 is configured to retain a single one of the spring contact pins 502, although some holes 504 may not contain a spring pin 502.

Each pin hole 504 includes a first diameter section 630, a second diameter section 632 and a third diameter section 634. The second diameter section 632 has a diameter greater than diameters of the first and third sections 630, 634. The diameters of the first and third sections 630, 634 may be equal. The diameter of the second diameter section 632 is selected to accommodate a diameter of a main body 650 of the spring contact pin 502. The second diameter section 632 may be formed completely in the first plate 620, completely in the second plate 622, partially in both the first and second plates 620, 622, or within an intervening plate (not shown disposed between the plates 620, 622) that is part of the body 402.

The first diameter section 630 is generally sized to allow a first plunger 652 to move axially within the first diameter section 630 of the pin hole 504. The first diameter section 630 is formed through the first plate 620 and is coaxial with the second diameter section 632.

The third diameter section 634 is generally sized to allow a second plunger 654 to move axially within the third diameter section 634. The third diameter section 634 is formed through the second plate 622 and is also coaxial with the second diameter section 632.

The interface between the first diameter section 630 and the second diameter section 632 forms a ledge 636. Since the main body 650 of the contact pin 502 is larger than the first diameter section 630, a shoulder 656 of the main body 650 contacts the ledge 636. Thus, as the shoulder 656 contacts the ledge 636, the main body 650 of the pin 502 is prevented from passing out of the interposer 160 through the first diameter section 630.

Similarly, the interface between the third diameter section 634 and the second diameter section 632 forms a ledge 638. Since the main body 650 of the contact pin 502 is larger than the third diameter section 634, a shoulder 658 of the main body 650 contacts the ledge 638. Thus, as the shoulder 658 contacts the ledge 638, the main body 650 of the pin 502 is prevented from passing out of the interposer 160 through the third diameter section 634. Accordingly, the ledges 636, 638 retain the pin 502 within the hole 504, thus capturing the contact pin 502 within the body 660 of the interposer 160.

The plates 620, 622 forming the body 660 of the interposer 160 in a suitable manner, such as a latch, fastener, and temporary adhesive, among others. One example of how the plates 620, 622 of the interposer 160 may be secured together is now described with reference to the top view of the interposer 160 illustrated in FIG. 5 with further reference to the sectional view of the interposer 160 illustrated in FIG. 7.

Figure 7:
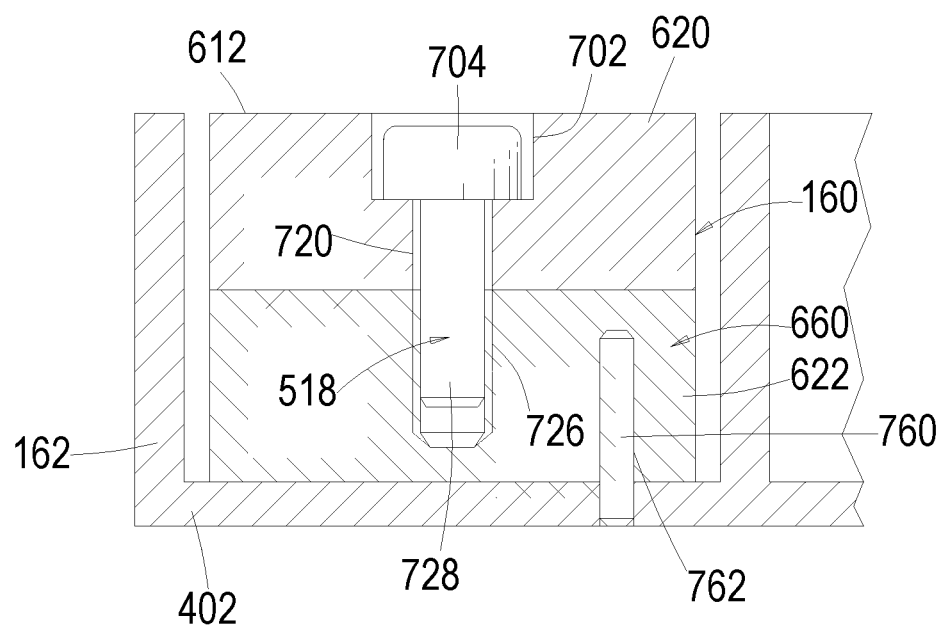
FIG. 7 is another sectional view of an interposer disposed in the mounting bracket.

As seen in the example depicted in FIGS. 5 and 7, a fastener 518 is utilized to secure the first plate 620 to the second plate 622 to form the body 660 of the interposer 160. The fastener 518, or other fastener, may additionally be is utilized to secure any intervening plates disposed between the first plate 620 to the second plate 622 that are part of the body 660. The fastener 518 is disposed in a fastener hole 516 formed in the plates 620, 622 of the body 660. The fastener hole 516 includes a clearance hole 720 formed in the first plate 620. The clearance hole 720 includes a counter bore 702 that accommodates a head 704 of the fastener 518 so that the fastener 518 may be disposed flush with or below the second surface 612 of the interposer 160 so as to allow the probe card board 158 to be clamped flush with the bracket 162 without interference from the interposer 160. The clearance hole 720 aligns with a threaded hole 726 formed in the second plate 622 of the body 402. A threaded end 728 of the fastener 518 engages the threaded hole 726 so that the fastener 518 may secure the plates 620, 622 together, which consequently retains the contact pins 502 between the ledges 636, 638 of the body 660, thus capturing the contact pin 502 within the hole 504 and the body 660 of the interposer 160.

The fastener 518 may be readily removed to allow the plates 620, 622 to be separated so that one or more of the contact pins 502 may be removed. Thus, the modularity of the interposers 160 allow contact pins 502 in individual interposers 160 to be replaced when needed, which saves on service costs both in the labor required to replace the modular interposer 160 and in the cost of the interposer 160 itself.

Also depicted in FIG. 7 is an alternative version of a mating feature 404 in the form of a locating pin 760 that extends from the bracket 162 into a mating aperture 762 formed in the body 410 of the interposer 160. The pin 760 and aperture 762 may be used in lieu of or in addition to the mating features 404, 406 illustrated in FIG. 4. In the embodiment depicted in FIG. 7, the pin 760 extends into the channel 202 and into the aperture 762 formed at least in the second plate 622 of the body 410. Optionally, the pin 760 and the aperture 762 may be configured such that the pin 760 extends into first plate 620 of the body 410. The pin 760 may be a dowel pin, c-section spring pin, or other suitable shape configured to mate with the complimentary geometry of the mating aperture The body 660 of the interposer 160 may be secured to the bracket 162 in a suitable manner, such as a latch, fastener, and temporary adhesive, among others. One example of how the body 660 of the interposer 160 may be secured to the bracket 162 is now described with reference to the top view of the interposer 160 illustrated in FIG. 5 with further reference to the sectional view of the interposer 160 illustrated in FIG. 8.

Figure 8:
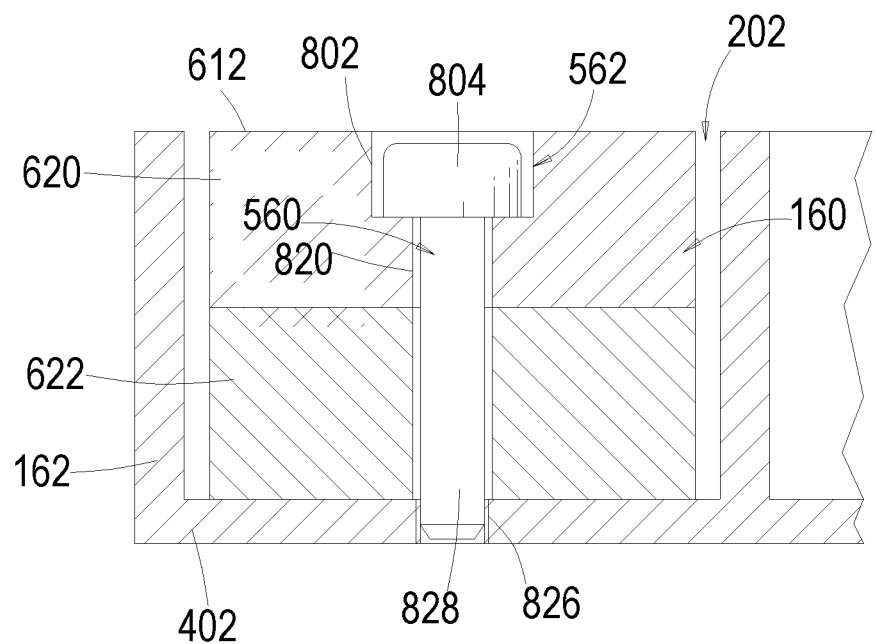
FIG. 8 is another sectional view of an interposer disposed in the mounting bracket.

As seen in the example depicted in FIGS. 5 and 8, a fastener 560 is utilized to secure the body 660 of the interposer 160 to the bracket 162. The fastener 560 is disposed in a fastener hole 562 formed through the interposer 160. The fastener hole 562 includes a clearance hole 820 formed through the first plate 620 and the second plate 622. The clearance hole 820 includes a counter bore 802 that accommodates the head 804 of the fastener 560 so that the fastener 560 may be disposed flush with or below the second surface 612 of the interposer 160 so as to allow the probe card board 158 to be clamped flush with the bracket 162 without interference from the interposer 160. The fastener hole 562 aligns with a threaded hole 826 formed in the body 402 of the interposer 160. A threaded end 828 of the fastener 560 engages the threaded hole 826 so that the fastener 560 may secure the interposer 160 in the channel 202 of the bracket 162.

The fastener 560 may be readily removed to allow the interposer 160 through which the fastener 560 was engaged to be separated from the bracket 162 without disturbing any of the other interposers 160 still fastened to the bracket 162. Thus, the modularity of the interposers 160 allow individual interposers 160 to be replaced when needed, which saves on service costs both in the labor required to replace the modular interposer 160 and in the cost of the interposer 160 itself.

FIG. 9 is a flow diagram of method for assembling a probe head assembly, such as the probe head assembly 102 and the like.

The method 900 begins at operation 902 by coupling two for more plates of an interposer 160 to capture a plurality of spring contact pins 502 within the interposer 160. For example, the contact pins 502 may be retained by ledges 636, 638 formed within the spring pin holes 504 that prevent the body 650 of the contact pin 502 from passing through the plates 620, 622 forming the body 660 of the interposer 160.

At operation 904, the interposer 160 is secured in the bracket 162. For example, the interposer 160 may be secured in a channel 202 of the bracket 162 in a manner that places the interposer 160 end to end with other interposers disposed in the channel. The end to end interposers 160 may be arranged in a ring shape. In one example, each interposer 160 is independently and separately coupled to the bracket 162 such that each interposer 160 may be independently replaced without removing the other interposers 160 from the bracket 162.

At operation 906, a stack of probe head assembly substrates including the bracket 162 containing the interposer 160 are assembled to form a probe head assembly 102. The stack of probe head assembly substrates may include a stiffener plate 166, a probe interface board (PIB) substrate 164, the bracket 162 with interposers 160, a probe card board 158 and a probe card 122.

After assembly at operation 906, the probe head assembly 102 is ready for use on a test system, such as the test system 100 described above, among others. Should the probe head assembly 102 need to be disassembled, the captured pins 502 within the interposer 160 prevent damage or wasted service time due to loose or lost pins 502 which often fall out of conventional probe head assemblies. Moreover, such any of the pins 502 within an interposer 160 become damaged, that specific interposer may be removed without removing the other interposers, thereby allowing the pins to be replaced or a new interposer installed in the head assembly 102 with much reduced service time and labor costs as compared to servicing conventional systems.

While the foregoing is directed to examples of the present disclosure, other and further examples of the disclosure may be devised without departing from the basic scope thereof, and the scope thereof is determined by the claims that follow.

What is claimed is:

1. A probe head assembly comprising:
   a rigid stiffener plate;
   a PIB substrate;
   a bracket,
   a plurality of interposers disposed in the bracket;
   a probe card board electrically coupled by a plurality of contact pins disposed through the interposers to the PIB substrate; and
   a probe card electrically coupled to the probe card board, wherein the PIB substrate, the interposers and the probe card board are sandwiched between the stiffener plate and the probe card.

2. The probe head assembly of claim 1, wherein interposers are arranged in a ring.

3. The probe head assembly of claim 2, wherein a first interposer of the plurality of interposers comprises:
   a first plate; and
   a second plate coupled to the first plate and capturing a first group of contact pins of the plurality of contact pin therebetween, ends of the contact pins comprising the first group of contact pins extending through the first plate and the second plate, the ends projecting beyond the interposer.

4. The probe head assembly of claim 1, wherein a first interposer of the plurality of interposers comprises a mating feature and the bracket further comprises a complimentary mating feature.

5. The probe head assembly of claim 4, wherein one of the complimentary mating features comprises:
   a projection extending from the bracket.

6. The probe head assembly of claim 5, wherein a second interposer of the plurality of interposers mates with the projection.

7. The probe head assembly of claim 5, wherein the projection extending from the bracket comprises:
   a dowel pin engaging the first interposer.

8. The probe head assembly of claim 4, wherein the bracket further comprises:
   a channel in which the interposers are retained.

9. The probe head assembly of claim 8, wherein the channel has a ring shape.

10. The probe head assembly of claim 8, wherein the bracket comprises:
    a plurality of apertures formed therethrough, the apertures open to the channel and having ends of the contact pins passing therethrough.

11. A probe head assembly comprising:
    a rigid stiffener plate;
    a PIB substrate;
    a plurality of interposers comprising a first interposer and a second interposer, the first interposer comprising a plurality of contact pins captured within the interposer;
    a bracket having the first and second interposers secured thereto, each of the first and second interposers independently removable from the bracket;
    a probe card board electrically coupled by the contact pins disposed through the first interposer to the PIB substrate; and a probe card electrically coupled to the probe card board, wherein the PIB substrate, the first and second interposers, and the probe card board are sandwiched between the stiffener plate and the probe card.

12. The probe head assembly of claim 11, wherein bracket further comprises:
   a channel having the first and second interposers disposed therein, an end of the first interposer disposed adjacent to an end of the second interposer.

13. The probe head assembly of claim 12, wherein the channel has a ring shape.

14. The probe head assembly of claim 12, wherein the bracket comprises:
   a plurality of apertures formed therethrough, the apertures open to the channel and having a portion of the contact pins disposed therethrough.

15. The probe head assembly of claim 14, wherein the first interposer further comprises:
   a first plate;
   a second plate coupled to the first plate; and
   a plurality of contact pin holes formed through the first and second plates, each contact pin hole having one of the contact pins captured therein.

16. The probe head assembly of claim 12, wherein a first interposer of the plurality of interposers comprises a mating feature and the bracket further comprises a complimentary mating feature.

17. The probe head assembly of claim 16, wherein one of the complimentary mating features comprises:
   a projection extending from the bracket.

18. The probe head assembly of claim 17, wherein the second interposer mates with the projection.

* * * * *